United States Patent [19]

Cooper et al.

[11] Patent Number: 4,620,179
[45] Date of Patent: Oct. 28, 1986

[54] METHOD FOR SUCCESSIVE APPROXIMATION A/D CONVERSION

[75] Inventors: Frank R. Cooper, West Melbourne; Kanti Bacrania, Palm Bay, both of Fla.

[73] Assignee: Harris Corporation, Melbourne, Fla.

[21] Appl. No.: 771,160

[22] Filed: Aug. 30, 1985

Related U.S. Application Data

[63] Continuation of Ser. No. 527,482, Aug. 29, 1983.

[51] Int. Cl.$^4$ .............................................. H03M 1/08
[52] U.S. Cl. ...................... 340/347 AD; 340/347 CC
[58] Field of Search .................................. 340/347 AD

[56] References Cited

U.S. PATENT DOCUMENTS

| | | | |
|---|---|---|---|
| 3,216,001 | 11/1965 | Hinrichs | 340/347 AD |
| 3,460,131 | 8/1969 | Gorbatenko et al. | |
| 3,588,884 | 6/1971 | Quereshi et al. | |
| 3,603,970 | 9/1971 | Bailey et al. | |
| 3,735,392 | 5/1973 | Kaneko | 340/347 AD |
| 3,781,877 | 12/1973 | Mattern | |
| 3,938,188 | 2/1976 | Fletcher et al. | |
| 3,967,269 | 6/1976 | Fletcher | |
| 4,124,844 | 11/1978 | Black et al. | |
| 4,196,421 | 4/1980 | Decoursey | 340/347 AD |
| 4,315,254 | 2/1982 | Honjyo et al. | |
| 4,323,885 | 4/1982 | Carriere et al. | |

OTHER PUBLICATIONS

Schulz "Analog-to-Digital Converter with Noise Rejection" IBM Technical Disclosure Bulletin, vol. 15 No. 6, Nov. 1972, pp. 2007-2008.

Primary Examiner—Charles D. Miller
Attorney, Agent, or Firm—Barnes & Thornburg

[57] ABSTRACT

A method of successive approximation A/D conversion employing an N bit internal D/A converter and an N bit SAR is provided wherein the first X bits are approximated to within less than the desired accuracy for N bit successive approximation while the last Y bits are approximated to within at least the desired accuracy for N bit successive approximation. After the Xth bit approximation, the A/D converter may be allowed sufficient time to settle to within the desired accuracy for N bit approximation during an error correction stage which increments or decrements the digital signal for the first X bits.

10 Claims, 2 Drawing Figures

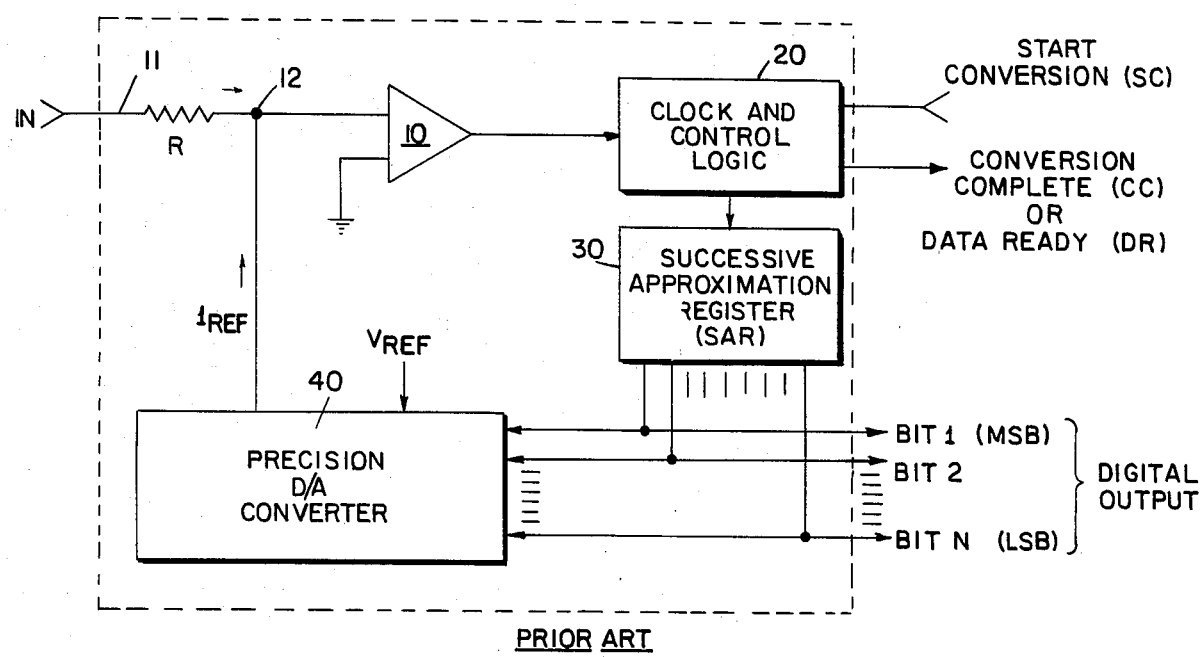
PRIOR ART
FIG. 1
FIG. 2
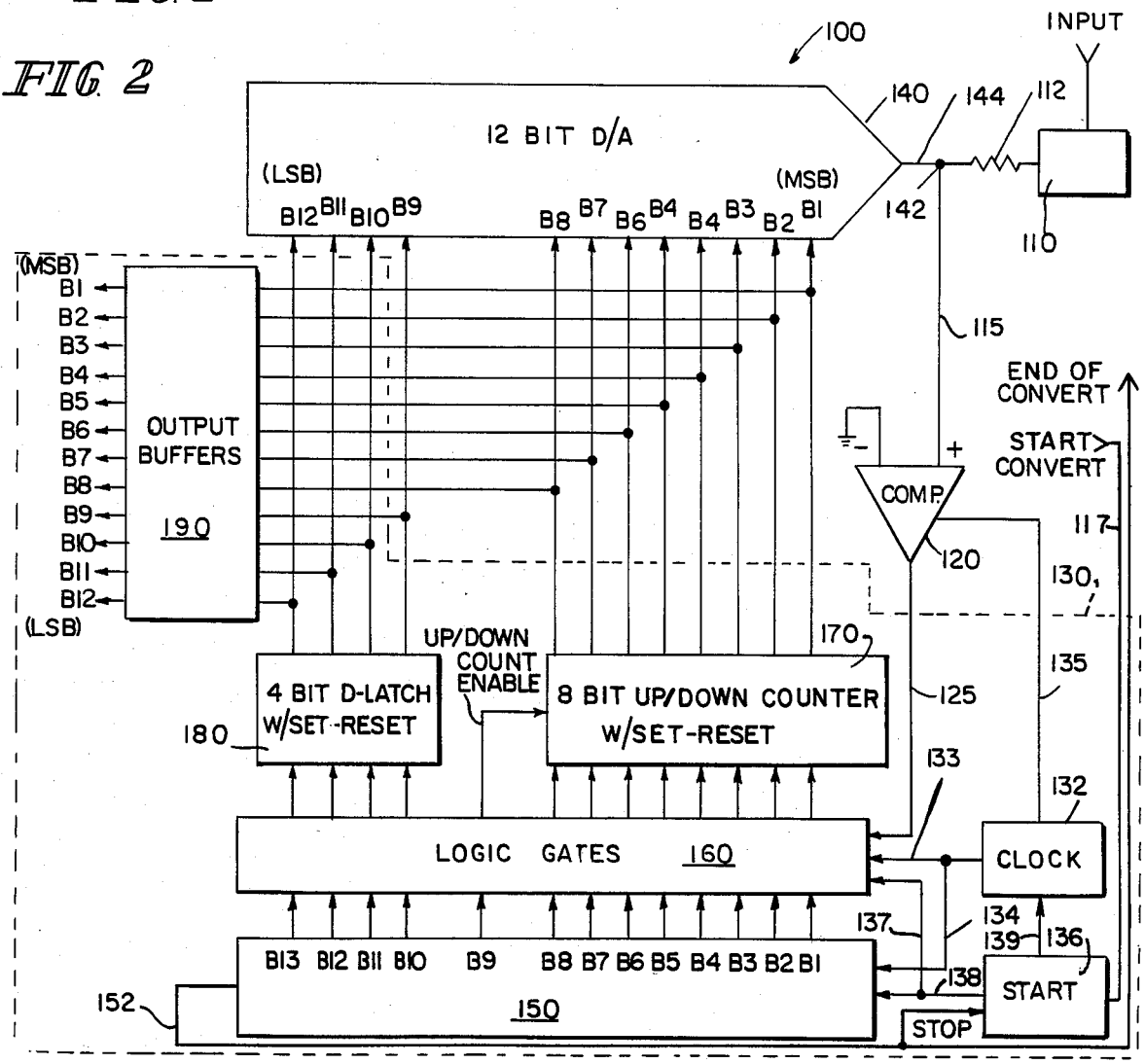

METHOD FOR SUCCESSIVE APPROXIMATION A/D CONVERSION

This is a continuation, of application Ser. No. 527,482, filed Aug. 29, 1983.

BACKGROUND OF THE INVENTION

The present invention relates generally to analog to digital signal converters and, more particularly, to such converters using a successive approximation conversion method.

Successive approximation methods of analog to digital conversion are well-known in the art for producing accurate and relatively high speed digital conversion. Generally, prior art converters using this method compare an unknown analog input signal to one or more precisely known reference signals in a series of digit generating comparison steps. In each step, the relative magnitudes of the analog input signal and the reference signal are compared and an error or difference signal is generated which is compared with another reference signal during the next succeeding step. Each such comparison step provides a digit of the final output signal in descending digital order until the desired level of quantization is reached.

A typical prior art successive approximation analog to digital (A/D) converter is shown in FIG. 1. An analog input signal is applied to comparator means 10 along input line 11. Comparator means 10 outputs a signal to clock and control logic means 20 which controls an internal successive approximation register 30 for producing digital outputs as a function of the output signals from comparator means 10. The digital outputs from successive approximation register 30 activate the bits in internal digital to analog (D/A) converter means 40, which has a known internal reference voltage applied thereto. The output from D/A converter means 40 is also applied to comparator means 10. The signal from comparator means 10 to clock and logic control means 20 represents the difference between the analog input signal and the analog output signal from internal D/A converter means 40.

Conversion is initiated by an externally supplied pulse to clock and logic control means 20. All bits except the most significant bit (MSB) are initially turned off. Control logic means 20 then sets one bit at a time in successive approximation register 30 in either a high or low state depending upon the output of comparator means 10. The MSB is initially set high, corresponding to a logical 1 and, thus, D/A converter means 40 produces an analog signal equal to one-half full scale. The output signal from D/A converter means 40 is compared to the input signal along line 11 at summing junction 12. If the former signal is less than the input signal, comparator means 10 causes successive approximation register 30 to leave the MSB at logical 1 and, as the clock continues, bit 2 (MSB-1) is also set at logical 1. If the signal output from D/A converter means 40 is greater than the input signal, the MSB is reset to logical 0 before proceeding to bit 2. Any succeeding bit that does not cause the combined bit currents' output from D/A converter means 40 to exceed the input signal remains set at logical 1, and any bit that causes the combined bit output signal from D/A converter means 40 to exceed the input signal is reset to a logical 0. After the final, or least significant bit (LSB) has been tried, successive approximation register 30 transmits a conversion complete signal. The output of successive approximation register 30 at this time is a digital number representing the analog input as a fraction of the internal reference voltage applied to D/A converter means 40.

Typically in such prior art successive approximation converters, each comparison decision made during the conversion is irrevocable. This means that the digits, once set within the successive approximation register, cannot be changed. Incorrect digits resulting from an erroneous comparison degrades the accuracy of the total output conversion signal. Incorrect comparisons may result from limitations in the comparison circuits themselves, such as transient recovery and response or static accuracy limitations, or by transient errors in the circuits which supply the comparison circuits with the reference voltages to be compared. While some A/D converters in the prior art do include a means of correcting an erroneous digital count, these usually require complicated signal amplifiers and track and hold circuits which increase the cost of production and significantly slow down conversion time.

The speed of successive approximation converters is determined by the amount of time required for the execution of each comparison step. Generally, sufficient time must be allowed prior to the next comparison to permit the transient errors of the circuit to settle out to a necessary minimum level so that an accurate comparison can be made. For converters digitizing to an N bit digital number, N periods of settling are required. Of the three basic components in these converters, the successive approximation register, the D/A converter, and the comparator, the settling time of the D/A converter and the comparator combination to better than one-half bit accuracy, the typically desired level, usually determines the time for each period. For example, if the D/A converter and comparator settle to one-half bit accuracy in one microsecond per period for a 12 bit converter, then the total minimum conversion time is approximately 12 microseconds.

Since it is generally desirable to decrease the conversion time and increase the speed of operation of such converters, several attempts have been made in the prior art to decrease the settling time allowed for each bit level. However, simply reducing the settling time at each bit level will compromise the conversion accuracy.

It is known to use two step or course/fine conversion techniques to increase the conversion speed, but only at a cost of significantly increased circuit complexity. In such two step processes, the digital bits are tried in two groups by separate A/D converter means. Conversion speed is increased because each set of bits may be successively approximated simultaneously and the settling time for each bit is reduced since less accuracy is required.

It is also known to increase conversion speed by employing multiple settling clocks, different for each bit level of successive approximation. However, this again substantially increases the circuit complexity and cost, as opposed to circuits using a single settling time clock for all bit levels.

Further, it has been suggested to employ multi step conversion techniques through a single set of successive approximation register hardware with a single settling time clock in order to get N bit accuracy from hardware elements scaled for significantly less than N bits. However, such circuits emphasize accuracy considerations and are not concerned with increasing the conversion speed of a system already maintaining N bit accuracy, nor do they suggest means to compensate for conversion errors experienced in speeding up the conversion time.

Thus, there exists a need for a new successive approximation A/D converter which permits the conversion time to be significantly reduced without increasing successive approximation register complexity and yet maintaining conversion accuracy within a desired level.

OBJECTS AND SUMMARY OF THE INVENTION

An object of the present invention is the provision of a novel analog to digital converter employing an improved successive approximation method.

Another object of the present invention is to provide a successive approximation-type analog to digital converter which is capable of higher speed, more accurate operation, and employing circuit elements of a comparable tolerance level and cost to presently available, less efficient converters.

Still another object is the provision of an A/D converter employing a successive approximation signal conversion method that is capable of correcting erroneous output digits previously generated due to circuit inaccuracies during a digit conversion cycle.

A further object is to provide a successive approximation A/D converter wherein correction of erroneous output digits occurs within the digit conversion cycle at a location which permits optimizing of the reduction in conversion time.

These and other objects of the present invention are attained through knowledge of the settling time characteristics of the internal D/A converter - comparator combination in terms of bit accuracy versus time and by providing correction means which functions digitally. The method of signal conversion according to the present invention involves use of an analog to digital converter means having an N bit internal digital to analog converter means and an N bit successive approximation register. The first X bits, where X is less than N, are successively approximated at less than the desired accuracy for the total N bit successive approximation. The remaining Y bits are successively approximated at the desired accuracy for N bit successive approximation. Between the successive approximation of these X and Y bit stages, the analog to digital converter may employ an error correction stage wherein settling time is extended to provide N bit accuracy for comparison and correction of the X bit digital signal. This decrease in conversion accuracy for the first X bits may be attained by decreasing the settling time permitted at each bit level. Thus, even though the error correction stage adds time to the overall conversion, the time saved from the X bits provides a net savings. System complexity is not added to significantly, since only single conversion loop circuitry and settling time clocks are employed.

Other objects, advantages, and novel features of the present invention will become apparent when the following description of the preferred embodiment is considered in conjunction with the drawings.

BRIEF DESCRIPTION OF THE DRAWINGS

FIG. 1 shows a block diagram of an A/D converter of a type known in the prior art.

FIG. 2 shows a block diagram of an A/D converter according to the principles of the present invention.

DESCRIPTION OF THE PREFERRED EMBODIMENTS

FIG. 2, which illustrates a preferred embodiment of the present invention, shows an analog to digital (A/D) converter 100 having input means 110, comparator means 120, successive approximation register (SAR) means 130, and internal digital to analog (D/A) converter means 140. Successive approximation register means 130 includes clock means 132, start control means 136, thirteen bit shift register 150, control logic gate means 160, eight bit down counter means 170 and four bit D-latch means 180, both with set-reset means, and output buffer means 190.

Input means 110 receives analog input signals to be digitized and transmits these signals to comparator means 120 along line 115. Typically, the input signals are electrical voltage levels. Resistor means 112 converts these voltage signals to analog current signals that are transmitted along line 115. Since the method of A/D conversion according to the present invention may be completed in a very short period of time, track and hold circuit means for most input signals are not necessary; the input signal is often stable over the total conversion time.

Comparator means 120 provides a digital output signal to successive approximation register means 130 in response to a difference between two signals applied thereto. Analog signals from input means 110 are used as one of these input signals. As will be discussed below, D/A converter means 140 provides the other input analog signals. Comparator means 120 may advantageously compare analog currents and, thus, produce signals at a much faster rate than voltage comparators.

Control logic gate means 160 receives the output of comparator means 120 along line 125. Another input to gate means 160 are clock signals from clock means 132 along line 133 and reset signals from start control means 136 along line 137. Clock means 132 also provides a comparator strobe signal to comparator means 120 along line 135 and a clock signal to shift register means 150 along line 134. Start control means 136 receives an input signal along line 117, and also provides a clock enable signal to clock means 132 along line 139 and a reset signal to shift register means 150 along line 138. Shift register means 150 services control logic gate means 160 and outputs a stop or conversion complete signal to start control means 136 along line 152 after the last bit (LSB) has been compared, as will be discussed further below.

In conjunction with shift register 150 and control logic gate means 160, bit by bit control of down counter 170 and D-latch 180 is provided during the A/D conversion steps as well as the correction cycle in response to output signals from comparator means 120. While SAR elements 170 and 180 are shown to be separate and distinct units, the present invention contemplates the use of a single counter or latch-type register for all twelve bits, especially if an error correction stage is not employed.

Output signals from SAR means 130 activate the bits in internal D/A converter means 140. This converter means 140 is provided with a predetermined reference potential and outputs an analog current signal to summing junction 142 along line 144 to line 115. Thus, a second analog signal may be applied to comparator means 120.

The desired accuracy for an N bit A/D converter is typically ±½ LSB. For a 12 bit A/D converter, with a 10 V full scale, this may mean, for example, letting the signal settle to within 1.22 millivolts, or 0.01%. As is well known, the MSB's will take considerably more time to settle to this accuracy since they have the largest voltage difference. Thus, if a single settling time clock is employed, the settling time of the MSB will likely control the overall conversion time of the converter.

The operation of converter 100 and the method of A/D conversion according to the present invention proceeds as follows. As with the prior art device described above, an external start signal along line 117 to start control 136 causes all SAR means bits to be set to logical 0 except the MSB. However, where prior art A/D converters would allow each bit, including the MSB, sufficient time to settle to, for example, 0.01% accuracy, the present invention only permits the least significant bits sufficient time to settle to 0.01% accuracy; the X most significant bits are only permitted sufficient time to settle to some lesser accuracy, say, for example, 0.4%. Thus, where the bit by bit settling time requirements in prior art converters start off high and progressively decrease, the present invention permits a low MSB settling time that more nearly approaches the LSB settling time. The present invention accomplishes this without creating multiple independent conversion circuits and by increasing the complexity of the SAR means only slightly.

More specifically, according to the successive approximation method of the present invention, the first X bits of an N bit successive approximation are only permitted sufficient settling time to acquire an accuracy less than the desired accuracy for the total N bit conversion, which is ±½ LSB or 0.01% for 12 bit converters of the preferred embodiment. In the preferred embodiment, these eight X bits are permitted the same desired accuracy as if the A/D converter were only scaled to 8 bits, or 0.4% accuracy. The remaining four N-X, or Y LSB's are permitted to settle to within the desired accuracy for 12 bit conversion. This embodiment permits a single settling time clock to be employed for both X and Y bits settling times since the MSB settling time at 0.4% accuracy is longer than the MSB−(X+1) bit, the first of the Y LSB's, settling time to 0.01% accuracy. In the 12 bit preferred embodiment, the settling time for each bit level may be 0.50 T where T is the bit settling time for the MSB to N bit accuracy. Thus, the total conversion time of a 12 bit A/D converter may be one half the conversion time of prior art converters.

While this significant reduction of settling time of the most significant bits does result in some decrease in accuracy, after much experimentation and study the present inventors have found that the potential error factor introduced by this decrease is not usually significant, and in any case can be removed by an error correction cycle part way through the signal conversion process. Even with the added time required for this correction, the net savings in conversion time is significant.

Successive approximation register means 130 requires only two levels of logic: one to go into its registers to shift the bit states, and one to remember the bit state and decide whether to keep it turned on or off. The present invention modifies SAR means 130 only to include a correction cycle after the Xth bit. The function of SAR means 130 changes from shift and store to an up/down counter during the correction cycle.

In the 12 bit converter example above, the present inventors have found, after much experimentation and study, that the correction cycle should be initiated between the 7th and 9th bits for optimum conversion time reduction, if a single correction cycle is to be employed. While multiple correction cycles are contemplated by the present invention, in general they will not be desirable because each additional correction cycle requires a significant increase in conversion time and yet affords only nominal gains in overall accuracy.

The optimum location for the correction cycle may be determined along the following lines of analysis.

For an N bit converter, where X is the number of bits converted at an accuracy of full scale/$2^x$, and the remaining N-X bits are converted at an accuracy of full scale/$2^{(N+1)}$, and P is the internal logic delay, an equation that describes the overall conversion time can be written as follows:

$$t_{conv.} = NP + Xt(X) + (N-X+1)\, t(N+1).$$

$t(X)$ and $t(N+1)$ have been empirically found by the applicants to exhibit a behavior similar to a modified negative exponential such as:

$$A(X) = A_o e^{-Bt} + C/t,$$

where $A_o$ is the initial value, B and C are constants, $A(X)$ is the final desired accuracy equal to full scale/$2^x$ and t is time.

The constants B and C may be determined by curve fitting techniques using the settling time data obtained by measuring the D/A means 140 - comparator means 120 combination.

For integer values of X from X=1 to X=N+1, $t(X)$ may be determined by interation.

By substituting these values into the $t_{conv.}$ equation, a graphical solution indicating a conversion time minimum with respect to X may be obtained. For the specific exemplary application described above, X=8 provided the optimally minimal conversion time. Since this minimum is dependent upon the settling time characteristics of the D/A means 140 and comparator means 120 combination, X may of course assume a different value for a different application.

In the optimum 12 bit case then, after approximating the Xth bit, the converter is permitted sufficient time to settle within ½ LSB for N bit conversion at the 8th bit level. The voltages from input means 110 and internal D/A converter 140 are compared by comparator means 120 only to determine which is greater, not the magnitude of their difference. Thus, the comparison is done digitally and at high speeds. In a single step correction cycle, if the voltage from converter 140 is greater than the voltage from input means 110, the 8 bit count is decremented. Typically, it will suffice to decrease only the last bit level by one digital unit. In a two-stage correction cycle, the 8 bit count may be first incremented or decremented and then decremented again depending upon the voltage comparison. After the correction cycle is completed, the count continues to the Nth bit through register 180 until the last bit level is determined and an end of conversion signal is transmitted along line 152.

Although the present invention has been described above in detail, the same is by way of illustration and example only and is not to be taken as a limitation. The spirit and scope of the present invention are limited only by the terms of the appended claims.

What is claimed is:

1. A method of high speed digitizing of analog input signals to N bit digital numbers in a successive approximation analog to digital converter means having an internal digital to analog converter means and successive approximation register means both scaled for N bits comprising:
   a. supplying input signals to be digitized;
   b. successively approximating the states of the first X bits, where X is less than N and greater than one, at a rate which provides less than the desired accuracy of conversion for the first X bits of N bits of successive approximation conversion, but which provides at least the desired accuracy of conversion for the last Y bits, where Y plus X equals N;
   c. allowing the input signal to settle to at least the desired accuracy for N bits of successive approximation after successively approximating the Xth bit;
   d. comparing the input signal to a signal which is representative of said first X bits and digitally incrementing or decrementing at least one of said X bits in response to said comparison to correct for conversion inaccuracies; and
   e. successively approximating the states of the last Y bits, at said rate which provides at least the desired accuracy of conversion for said last Y bits, to complete the digitizing process.

2. The method of high speed digitizing according to claim 1, wherein said comparison is of the currents of said respective signals.

3. The method of high speed digitizing according to claim 1, wherein the states of said first X bits are successively approximated to within the desired accuracy of X bits of successive approximation conversion as if said internal digital to analog converter means and successive approximation register means were both scaled for X bits only.

4. The method of high speed digitizing according to claim 1, wherein N is twelve, X is eight, and Y is four.

5. A successive approximation analog to digital converter means for high speed digitizing of analog input signals to N bit digital numbers comprising:
   input means for receiving analog input signals to be digitized;
   comparator means connected to said input means for receiving analog input signals and for providing output signals as a function of the difference between first and second signals applied thereto;
   N bits successive approximation register means connected to said comparator means for producing digital output signals successively approximating the states of N bits of said digital numbers as a function of said output signals from said comparator means;
   N bit digital to analog converter means, connected to said N bit successive approximation register means and said comparator means, for producing analog signals as a function of the states of said N bits; and
   X bit counter means connected between the first X bits of the N bit successive approximation register means and the first X bits of the N bit digital to analog converter means, where X is less than N and greater than one;
   wherein said N bit successive approximation register means includes means for successively approximating the states of the first X bits at a rate which provides less than the desired accuracy of conversion for the first X bits of N bits of successive approximation conversion, but which provides at least the desired accuracy of conversion for the last Y bits, where Y plus X equals N;
   means for allowing the input signal to settle to at least the desired accuracy for N bits of successive approximation after successively approximating the Xth bit;
   means for comparing the input signal to a signal which is representative of said first X bits and means for digitally incrementing or decrementing said X bit counter in response to said comparison to correct for conversion inaccuracies; and
   means for successively approximating the states of the last Y bits, at said rate which provides at least the desired accuracy of conversion for said last Y bits, to complete the digitizing process.

6. The analog to digital converter means according to claim 5, wherein said correction means includes said comparator means and permits said comparator means to settle to at least the desired accuracy for N bit successive approximation conversion when correcting for conversion inaccuracies resulting up to said Xth bit of successive approximation.

7. The analog to digital converter means according to claim 6, wherein said correction means alters said digital signal produced in response to successive approximation to the Xth bit by increasing or decreasing the least significant bit of that digital signal prior to continuing successive approximation through the remaining N-X bits.

8. The analog to digital converter means according to claim 5, wherein the digital states of said X bits are successively approximated to within the desired accuracy of X bits of successive approximation conversion as if said successive approximation register means and said digital to analog converter means were scaled to X bits rather than N bits.

9. The analog to digital converter means according to claim 5, wherein N is twelve and X is eight.

10. The analog to digital converter means according to claim 5, wherein the settling time for successive approximation conversion at each of the N bit levels is substantially uniform.

* * * * *